(12) United States Patent
Pan et al.

(10) Patent No.: US 7,585,705 B2
(45) Date of Patent: Sep. 8, 2009

(54) METHOD FOR PREVENTING GATE OXIDE DAMAGE OF A TRENCH MOSFET DURING WAFER PROCESSING WHILE ADDING AN ESD PROTECTION MODULE ATOP

(75) Inventors: Mengyu Pan, Shanghai (CN); Zengyi He, Shanghai (CN); Kaiyu Chen, Shanghai (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 81 days.

(21) Appl. No.: 11/947,750

(22) Filed: Nov. 29, 2007

(65) Prior Publication Data

US 2009/0140333 A1 Jun. 4, 2009

(51) Int. Cl.
*H01L 21/20* (2006.01)
(52) U.S. Cl. ............... 438/141; 438/197; 438/206; 438/212; 438/237; 438/245; 438/268; 438/270; 438/272; 257/173; 257/328; 257/356; 257/E21.409; 257/E21.089
(58) Field of Classification Search ............. 438/141, 438/197, 206, 212, 237, 245, 268, 270, 272; 257/E21.409, E21.089, 173, 328, 356, E27.016, 257/E27.36, E29.015
See application file for complete search history.

(56) References Cited

U.S. PATENT DOCUMENTS 6,291,285 B1 9/2001 Wang
2008/0042208 A1* 2/2008 Hshieh ............ 257/360

* cited by examiner

*Primary Examiner*—Long K Tran
(74) *Attorney, Agent, or Firm*—Chein-Hwa Tsao; CHEMily LLC

(57) ABSTRACT

A method and device structure are disclosed for preventing gate oxide damage of a trench MOSFET during wafer processing while adding an ESD protection module atop the trench MOSFET. The ESD protection module has a low temperature oxide (LTO) bottom layer whose patterning process is found to cause the gate oxide damage. The method includes: a) Fabricate numerous trench MOSFETs on a wafer. b) Add a $Si_3N_4$ isolation layer, capable of preventing the LTO patterning process from damaging the gate oxide, atop the wafer. c) Add numerous ESD protection modules atop the $Si_3N_4$ isolation layer. d) Remove those portions of the $Si_3N_4$ isolation layer that are not beneath the ESD protection modules. In one embodiment, hydrofluoric acid is used as a first etchant for patterning the LTO while hot phosphoric acid is used as a second etchant for removing portions of the $Si_3N_4$ isolation layer.

19 Claims, 7 Drawing Sheets

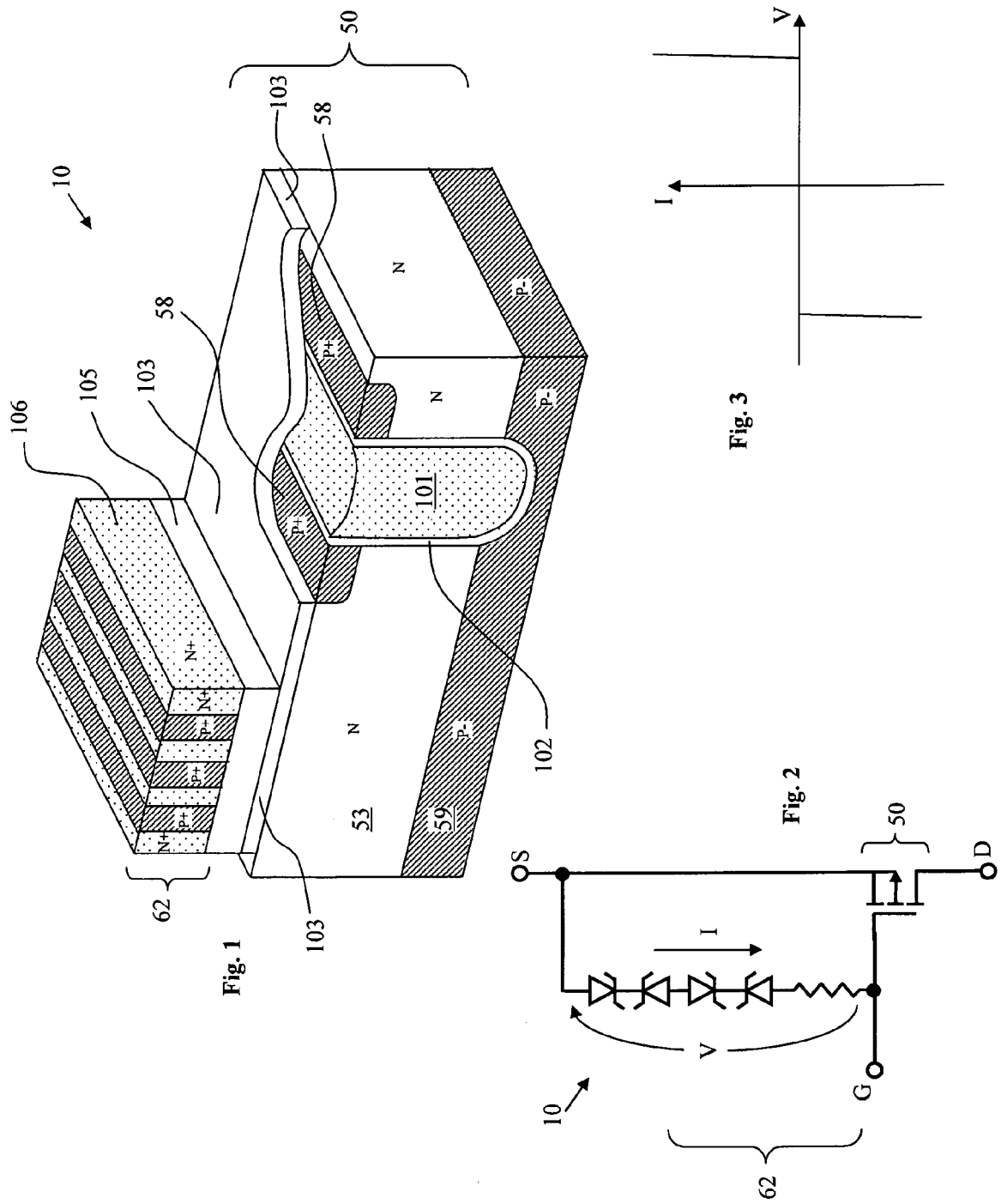

METHOD FOR PREVENTING GATE OXIDE DAMAGE OF A TRENCH MOSFET DURING WAFER PROCESSING WHILE ADDING AN ESD PROTECTION MODULE ATOP

CROSS REFERENCE TO RELATED APPLICATIONS

Field of Invention

This invention relates generally to the field of semiconductor device fabrication. More specifically, the present invention is directed to a technique and associated device structure to improve semiconductor device manufacturing yield.

BACKGROUND OF THE INVENTION

MOSFET (metal-oxide-semiconductor field effect transistor) devices have many industrial applications, such as power amplifiers, power switches and low noise amplifiers to name a few. For many such applications, the gate leakage current is one of the device performance parameters of key importance as it may impact the MOSFET drive capacity and its associated static power loss. An ideal zero gate leakage current is impossible to achieve in practice. To substantially reduce the gate leakage current by tuning an existing wafer processing parameter set is known to be difficult. Another conventional technology for reducing the gate leakage current is the reduction of threshold voltage by device design to reduce the static power loss. But reduction of threshold voltage has other system ramifications such as a correspondingly reduced device noise margin against a false turn-on. Hence there exists a continued need of consistently fabricating an MOSFET with lower gate leakage current. This becomes especially important for a trench MOSFET chip where the fabrication process to integrate additional function at the same chip can induce damage to the trench MOSFET—specifically, to the gate oxide—causing an excessive gate leakage current.

SUMMARY OF THE INVENTION

A method for preventing a gate oxide damage of a trench MOSFET while adding an electrostatic discharge (ESD) protection module atop the trench MOSFET is proposed. The ESD protection module has a bottom layer whose patterning process is known to cause the gate oxide damage to the trench MOSFET. The method includes:
a) Fabricate a wafer with the trench MOSFETs on it.
b) Identify an isolation layer material that can prevent the bottom layer patterning process of the ESD protection modules from damaging the gate oxide of the trench MOSFET. Form the isolation layer atop the wafer.
c) Add and pattern the ESD protection modules atop the isolation layer.
d) Remove those portions of the isolation layer that are not beneath the ESD protection modules.

Optionally, between steps b) and c), those portions of the isolation layer that are on top of portions of the upper body of the trench MOSFET whose material damage would not affect the function of the trench MOSFET can be removed.

In an embodiment where the patterning process for the bottom layer uses a first etchant, form the isolation layer of step b) further includes selecting an isolation layer material that exhibits a substantially lower etch rate compared to that of the bottom layer while using the first etchant.

In another embodiment where the removal process for the isolation layer uses a second etchant, form the isolation layer of step b) further includes selecting an isolation layer material that exhibits a substantially higher etch rate compared to that of the pad oxide and gate oxide while using the second etchant.

In a more specific embodiment, the upper body of the trench MOSFET is made of a bi-layer of a pad oxide thermally grown atop a patterned gate oxide. The pad oxide also extends over the rest of the wafer. The selected isolation layer material is $Si_3N_4$ and it is formed atop the pad oxide with a low pressure chemical vapor deposition (LPCVD) process. The bottom layer is made of a patterned low temperature oxide (LTO) deposited atop the isolation layer with a low temperature deposition process.

In a more specific embodiment, a hydrofluoric acid (HF) is chosen to etch the LTO whereas a hot phosphoric acid ($H_3PO_4$) is chosen to etch the $Si_3N_4$.

As a more specific semiconductor device made from the aforementioned methods, the specific device includes:
1. A semiconductor substrate with an active area and a termination area.
2. A number of trench MOSFET cells fabricated in the active area.
3. A number of ESD protection diodes fabricated atop the semiconductor substrate in the termination area.
4. An insulation layer made of Oxide/Nitride/Oxide (ONO) sandwiched between the ESD protection diodes and the semiconductor substrate, the nitride layer functioning as an oxide etching stop during the fabrication process.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative:

FIG. 1 is a perspective illustration of a semiconductor device having an ESD protection module atop a trench MOSFET;

FIG. 2 is an equivalent circuit of the semiconductor device of FIG. 1;

FIG. 3 illustrates a simplified I-V graph characteristic of the ESD protection module of FIG. 1;

DETAILED DESCRIPTION OF SPECIFIC EMBODIMENTS

Figure 4:
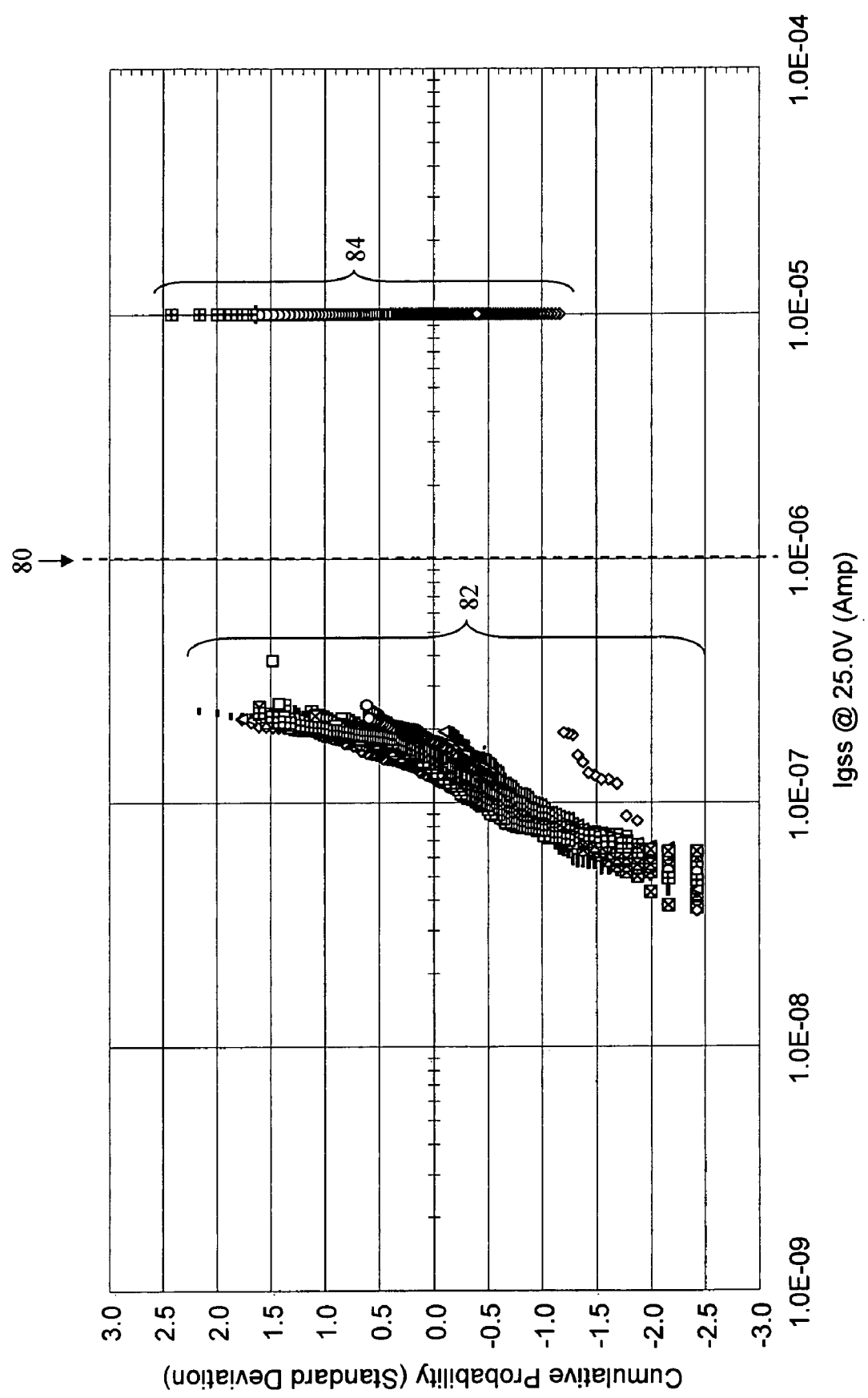
FIG. 4 is a scatter plot of the wafer fabrication statistics for the semiconductor device of FIG. 1 showing a substantial number of wafers exhibiting unacceptably high trench MOSFET gate leakage current.

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. 1 is a perspective illustration of a semiconductor device 10 having an ESD protection module 62 atop a trench MOSFET 50. The trench MOSFET 50 has a P– epitaxial layer 59 toward its bottom upon which are successive patterned layers of epitaxial MOSFET body layer 53 (N- or N type), P+ source regions 58 and a pad oxide 103. For simplicity, a bottom substrate of the trench MOSFET 50 is omitted here. The gate structure of the trench MOSFET 50 has a trenched gate polysilicon 101 electrode separated from the epitaxial MOSFET body layer 53 by a thin gate oxide 102. Atop the pad oxide 103 is the ESD protection module 62 that has a number of serially connected Zener diodes embedded in a polysilicon layer 106 host with a low temperature oxide (LTO) 105 base. This is illustrated with a horizontal sequence of alternating N+ and P+ regions atop the low temperature oxide (LTO) 105. FIG. 2 is an equivalent circuit of the semiconductor device 10 of FIG. 1 and FIG. 3 illustrates a simplified I-V graph characteristic of the ESD protection module of FIG. 1. To those skilled in the art, by now it should be clear that the ESD protection module 62 has multiple, serially connected Zener diodes for protecting the gate of the trench MOSFET 50 against various energy levels of electrostatic discharge. In this figure, the ESD protection module 62 has a PNPNP configuration, but any number of serially connected Zener diodes can be used. When the voltage reaches a certain threshold value, current is diverted out through the ESD protection module 62, thus protecting the fragile gate oxide 102. From a device functional perspective, the trench MOSFET 50 can thus be described as located within an active area whereas the ESD protection module 62 can be described as located within a termination area of the semiconductor device 10 chip.

FIG. 4 is a scatter plot of the wafer fabrication statistics for the semiconductor device of FIG. 1 showing a substantial number of fabricated wafers, the unacceptable wafer group 84, exhibiting unacceptably high trench MOSFET gate leakage current, Igss, at a gate-to-source voltage of 25 volts. Here, each plotted symbol (rhombus, square, circle, cross, etc.) represents one fabricated wafer. The measured gate leakage current, Igss, of each wafer, in units of amperes, is expressed along the horizontal-axis. The cumulative probability of the wafer data, relative to the wafer population median data indicated as zero (0), is expressed along the vertical-axis in units of sigma (standard deviation). In this case, an acceptance limit 80 was set at 1.0E-6 amps (1 microampere) distinguishing an acceptable wafer group 82 from the unacceptable wafer group 84. Notice that, as part of the function of the gate leakage current tester, all the Igss-data for the unacceptable wafer group 84 are artificially clamped to a safe low value of 1.0E-05 amps (10 microamperes) to prevent damage to the tester itself.

Based on a number of systematic experiments (not described here), the high trench MOSFET gate leakage current of the unacceptable wafer group 84 exhibits a high correlation with an LTO etching process that patterns the LTO 105 layer of the ESD protection module 62. Further failure analysis revealed poor gate oxide 102 quality at the top edge of the gate trench indicative of its material damage caused by the LTO etching process. Hence, the present invention proposes to add an isolation layer sandwiched between the trench MOSFET 50 and the LTO 105 to prevent the LTO patterning process from damaging the gate oxide 102. Specifically, $Si_3N_4$ is selected to be the isolation layer material as it exhibits a substantially lower etch rate compared to that of the LTO 105 while using an LTO etchant.

FIG. 5 through FIG. 11 illustrate a detailed wafer fabrication process of the present invention where a $Si_3N_4$ isolation layer 104 is added between the top of the trench MOSFET 50 and the bottom of the ESD protection module 62 to prevent a gate oxide 102 damage of the trench MOSFET 50. Again, for simplicity, a bottom substrate of the trench MOSFET 50 is omitted from these figures.

Figure 5:
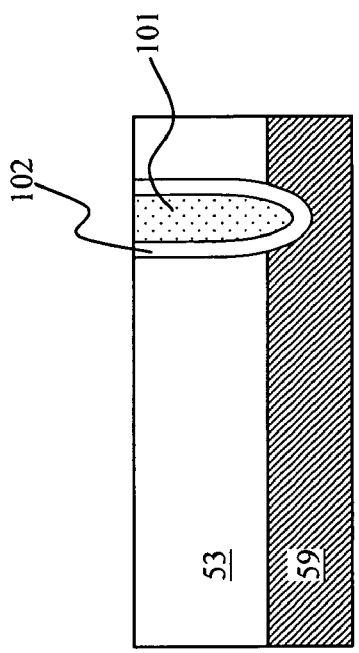
FIGS. 5 through FIG. 11 illustrate a detailed wafer fabrication process of the present invention wherein an isolation layer is added between the top of the trench MOSFET and the bottom of the ESD protection module to prevent a gate oxide damage of the trench MOSFET.

In FIG. 5, a gate oxide 102 is thermally grown then patterned inside a top trench of an already processed bi-layer of epitaxial MOSFET body layer 53 and epitaxial layer 59. A trenched gate polysilicon 101 is then deposited atop the gate oxide 102 and etched. The thickness of the gate oxide 102 can be adjusted in its growth process to suit various product requirements.

Figure 6:
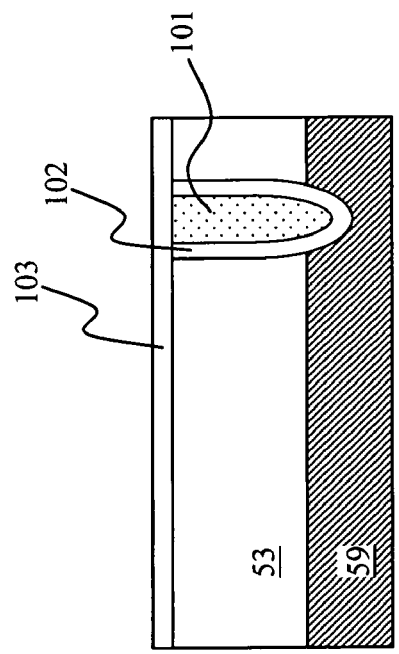

In FIG. 6 a pad oxide 103, about 200 Å in thickness, is then thermally grown at the top to protect both the trenched gate polysilicon 101 and the gate oxide 102.

At this point (in FIG. 7), the proposed $Si_3N_4$ isolation layer 104 of the present invention is formed at the top to protect the pad oxide 103, and subsequently the gate oxide 102 from a later LTO etching process. A low pressure chemical vapor deposition (LPCVD) process can be used to form the $Si_3N_4$ isolation layer 104. As an indicator of process consistency for high device yield, the thickness of the $Si_3N_4$ isolation layer 104 is maintained at an intra-wafer uniformity of <3% tolerance and at an inter-wafer uniformity of <10% tolerance.

Figure 8:
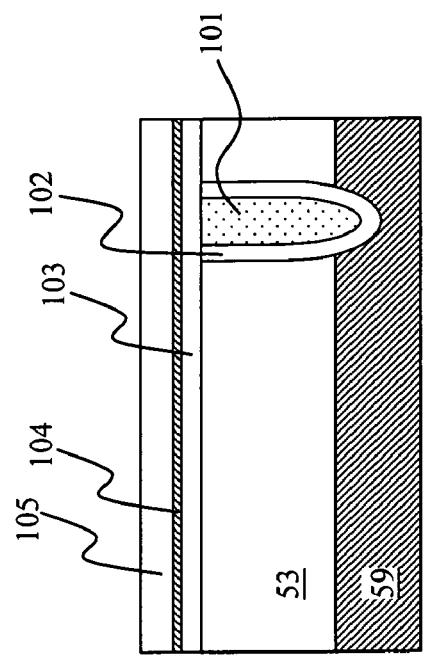

In FIG. 8, fabrication of the ESD protection module 62 starts with an LTO 105 deposition, about 1500 Å, atop the $Si_3N_4$ isolation layer 104 to further isolate additional upper ESD protection module 62 layers from the Silicon substrate. The LTO 105 can be deposited with a low temperature deposition process, an example being a chemical vapor deposition (CVD) at temperature typically below 500 deg C.

Figure 9:
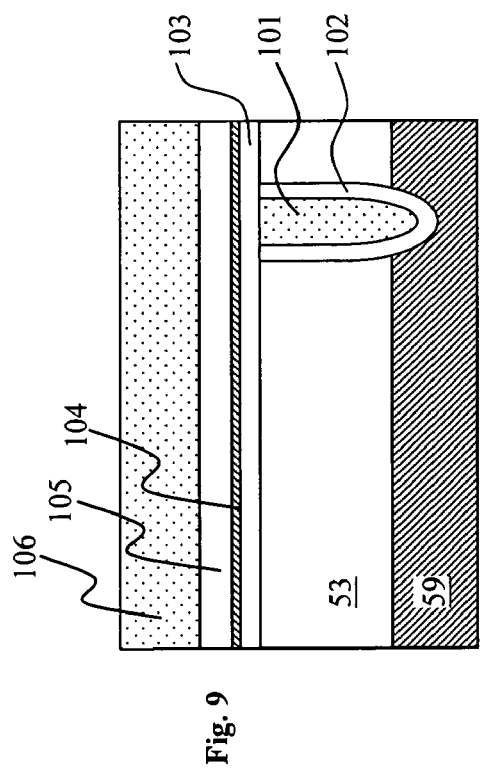

In FIG. 9 a polysilicon layer 106 is deposited at the top to become the host material for the ESD protection module 62. A number of more detailed steps of ESD polysilicon implant, ESD diode background doping, ESD polysilicon masking, formation of ESD diode areas, ESD polysilicon dry etch and over etch that stops at the LTO 105 are not shown here to avoid unnecessary obscuring details that are not essential to the understanding of the present invention. In any case, afterwards the ESD protection module 62 is fully formed.

Figure 10:
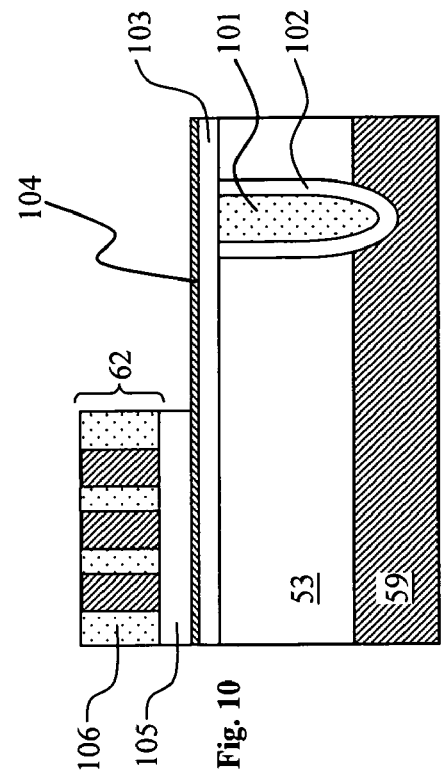

FIG. 10 illustrates a highly important step of the present invention where the LTO 105 outside the ESD protection module 62 area is patterned then removed with a wet oxide etch. Here, an etch chemical should be chosen with good selectivity between the LTO 105 and the $Si_3N_4$ isolation layer 104 to effect an etch stop at the $Si_3N_4$ isolation layer 104. That is, the LTO-etch chemical should further maximize a differential etch rate between the LTO 105 and the $Si_3N_4$ isolation layer 104 to insure that, at the completion of the LTO patterning process, sufficient amount of $Si_3N_4$ is still left to protect the pad oxide 103 layer underneath. As one specific embodiment a hydrofluoric acid (HF) is used to etch the LTO 105.

Starting with an original $Si_3N_4$ isolation layer 104 thickness of around 60 Å, a remaining thickness of about 34 Å is still left after the LTO etch.

Figure 7:
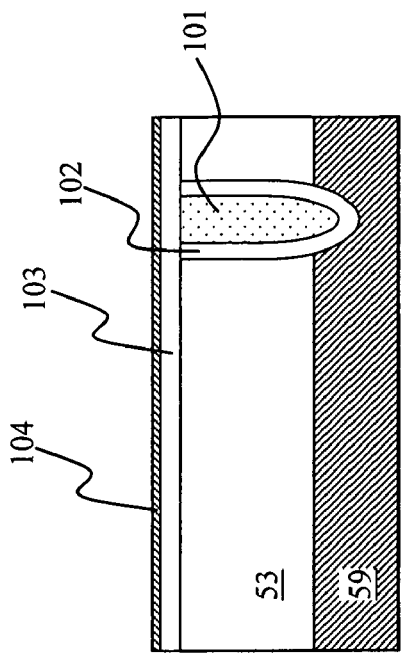
Figure 11:
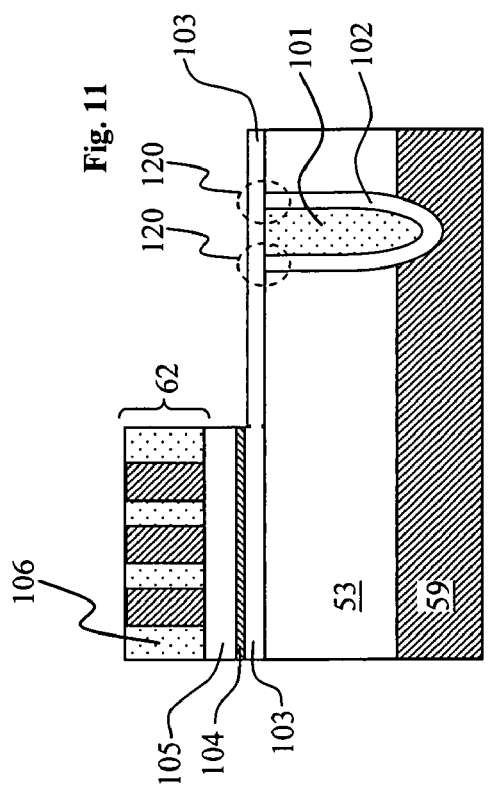

FIG. 11 illustrates another highly important step of the present invention where the $Si_3N_4$ isolation layer 104 outside the ESD protection module 62 area is finally removed with a wet nitride-etch. Here, an etch chemical should be chosen with good selectivity between the $Si_3N_4$ isolation layer 104 and the pad oxide 103 to effect an etch stop at the pad oxide 103. That is, the nitride-etch chemical should further maximize a differential etch rate between the $Si_3N_4$ isolation layer 104 and the pad oxide 103 to insure that, at the completion of the nitride-etch process, sufficient amount of pad oxide is still left to protect the gate oxide 102 layer underneath. As one specific embodiment a hot phosphoric acid ($H_3PO_4$) is chosen to etch the $Si_3N_4$ isolation layer 104. Following the completion of the $Si_3N_4$ isolation layer 104 removal, the $H_3PO_4$ has only removed about 10 Å from the pad oxide 103 (about 200 Å as grown) underneath thus protecting the critical damage protection areas 120 of the gate oxide 102 from being damaged. As a side remark regarding the critical damage protection areas 120, following the wafer processing step as depicted in FIG. 7, the present invention allows the freedom of patterning then removing those portions of the $Si_3N_4$ isolation layer 104 that are on top of portions of the upper body of the trench MOSFET 50 whose material damage would not affect the function of the trench MOSFET 50, i.e., portions of the $Si_3N_4$ isolation layer 104 that are not located directly above the critical damage protection areas 120.

Figure 12:
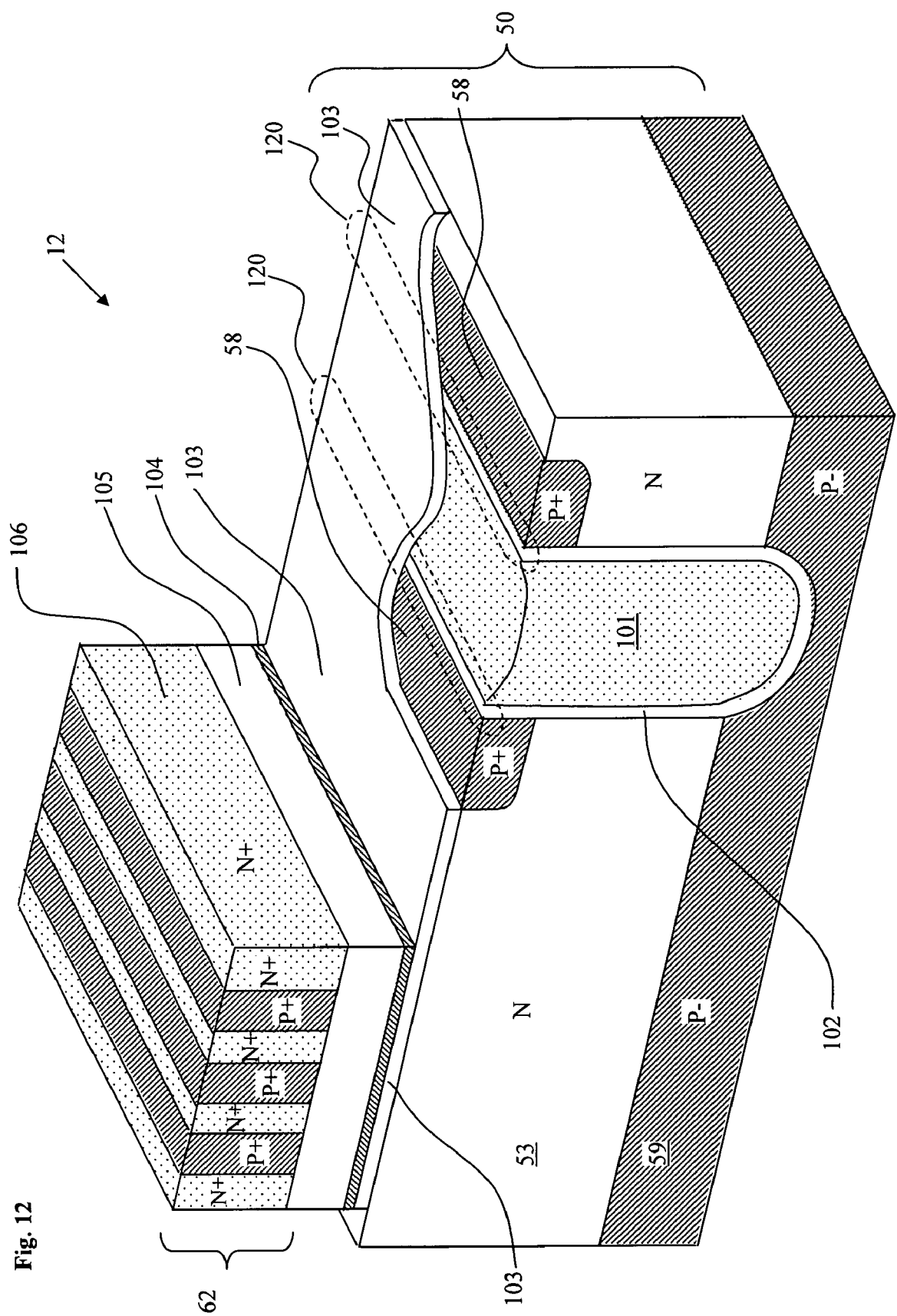
FIG. 12 is a perspective illustration of the resulting improved semiconductor device with the added isolation layer.

FIG. 12 is a perspective illustration of the resulting semiconductor device with isolation layer 12 wherein the added $Si_3N_4$ isolation layer 104 is now sandwiched between the LTO 105 and the pad oxide 103. Thus, the remaining pad oxide 103 still covers up and protects the critical damage protection areas 120 underneath. Notice the LTO 105-$Si_3N_4$ isolation layer 104-pad oxide 103 (ONO) tri-layer also forms an effective insulation layer between the ESD protection module 62 and the semiconductor substrate. Again for simplicity, a bottom substrate of the trench MOSFET 50 is omitted here.

While not graphically illustrated here, numerous other device parameters of the trench MOSFET 50 following the present invention are compared with those before the present invention to confirm that no other undesirable side effects are introduced. The threshold voltage (Vth) is found only slightly lower than before. The average drain-source on-state resistance (Rdson) shows no difference from before. A final statistical analysis of Vth, Rdson and Bvdss (drain-source breakdown voltage with gate-source shorted) concludes that the device parameters shiftings are all within their allowable margin.

Figure 13:
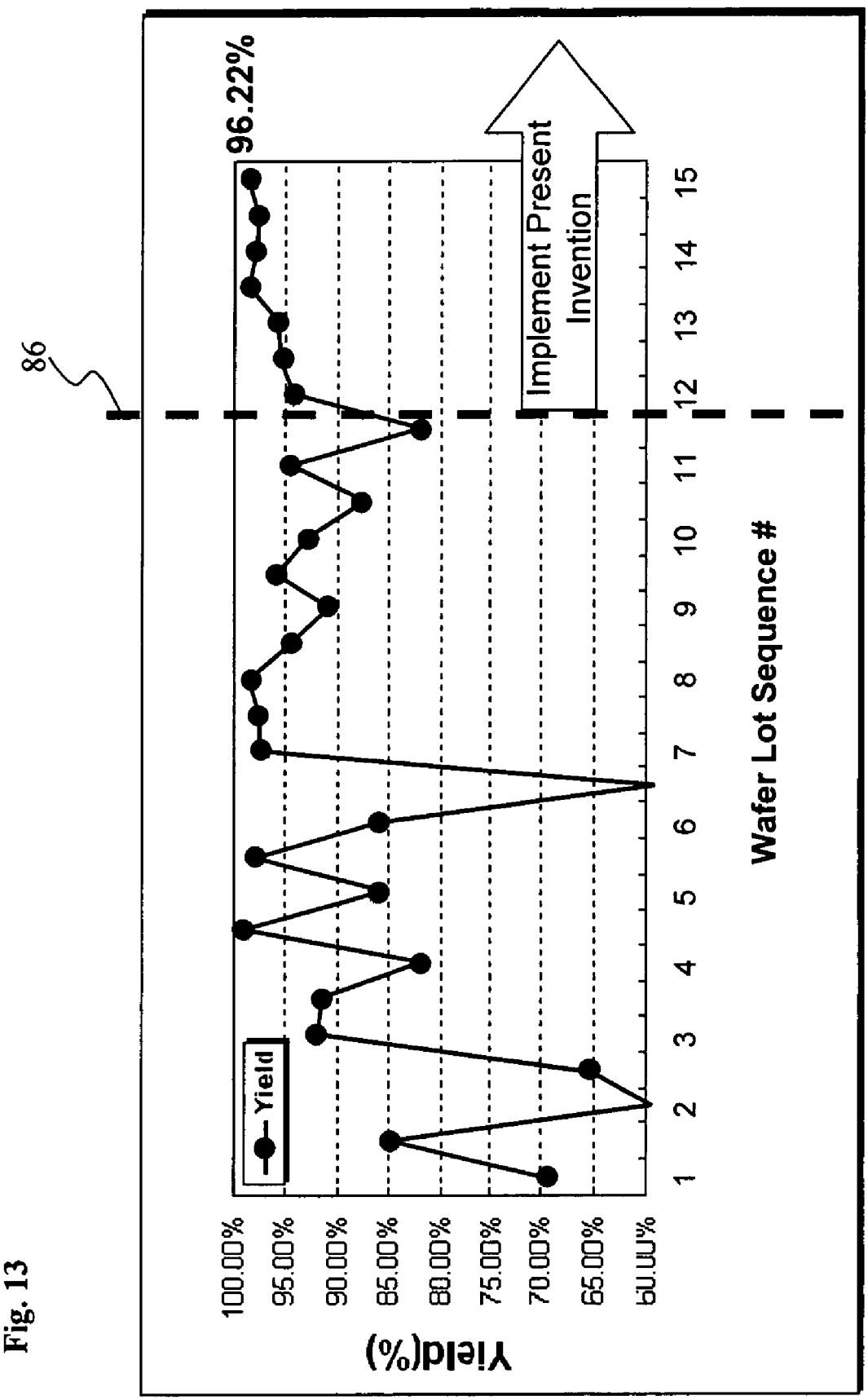
FIG. 13 is a history plot of fabrication yield vs. wafer lot sequence number illustrating a major improvement of the yield following an implementation of the present invention method.

FIG. 13 shows a history plot of fabrication yield (%) vs. wafer lot sequence number with a dividing wafer lot 86 (lot sequence #12) marking the introduction of the present invention. Notice the fluctuation of yield between 59% and 99% before the dividing wafer lot 86. Following the dividing wafer lot 86 the yield remains consistently above 94%. Expressed in terms of average yield, the present invention improves it from 82.0% to 96.2%.

Figure 14:
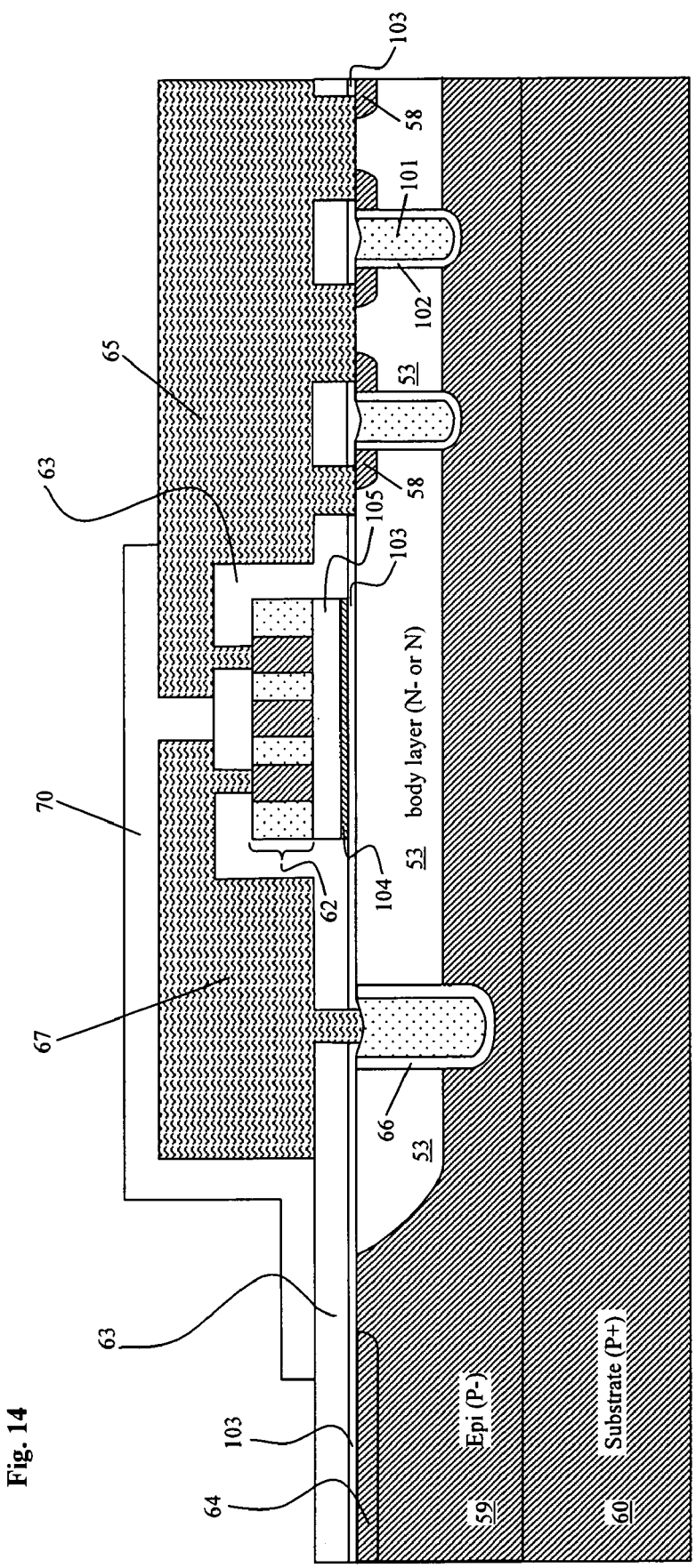
FIG. 14 illustrates a cross section of the final product using the present invention.

Finally, FIG. 14 illustrates a cross section of the final product built upon a substrate 60 using the present invention. The gate structure of the trench MOSFET 50 is built with a gate contact trench 66 atop which is a gate contact metal 67. The trenched gate polysilicon 101 is connected to the gate contact trench 66 in the third dimension (not shown). A channel stopper 64 delimits the active channel zone of the trench MOSFET 50. A source contact metal 65 contacts the numerous source regions 58 from the top. Where isolation is required, a borophosphosilicate glass (BPSG) 63 layer is provided to isolate the source contact metal 65 and gate contact metal 67. A top passivation layer 70 passivates the final product wherever needed.

While the description above contains many specificities, these specificities should not be constructed as accordingly limiting the scope of the present invention but as merely providing illustrations of numerous presently preferred embodiments of this invention. To those skilled in the art, it should become clear that the invention is applicable to multiple and other varieties of semiconductor devices integrated on a single die as well. The invention is further applicable to protecting other parts of the semiconductor device in addition to the gate oxide as illustrated here, such as a shallow polysilicon gate electrode. The invention also expects to be applicable to other types of semiconductor substrate with their corresponding material set for the isolation layer and the etchants as well, such as Germanium (Ge), Silicon-Germanium (SiGe), Gallium-Arsenide (GaAs), etc.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. For example, though this application describes a P-channel MOSFET, the invention is equally applicable to N-channel MOSFETs. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. A method for preventing a gate oxide damage of a trench MOSFET during wafer processing while adding an electrostatic discharge (ESD) protection module atop the trench MOSFET, said ESD protection module having a bottom layer whose patterning process is known to cause the gate oxide damage to the trench MOSFET, the method comprises sequential steps:
   a) providing a wafer with a plurality of the trench MOSFETs fabricated thereon;
   b) providing an oxide layer on top of the wafer
   c) adding an isolation layer, capable of preventing the bottom layer patterning process from damaging the gate oxide of the trench MOSFET, over the oxide layer atop the wafer;
   d) providing an oxide layer over the isolation layer;
   e) adding and patterning the ESD protection modules atop the isolation layer;
   f) removing those portions of the isolation layer that are not beneath the ESD protection modules.

2. The method for preventing a gate oxide damage of claim 1 further comprises, between step b) and step C):
   b1) removing those portions of the isolation layer that are on top of portions of the upper body of the trench MOSFET whose material damage would not affect the function of the trench MOSFET.

3. The method for preventing a gate oxide damage of claim 1 wherein the patterning process for the bottom layer uses a first etchant and, correspondingly, adding an isolation layer further comprises selecting an isolation layer that exhibits a substantially lower etch rate compared to that of the bottom layer while using the first etchant.

4. The method for preventing a gate oxide damage of claim 3 wherein the removal process for the isolation layer uses a second etchant and, correspondingly, adding an isolation layer further comprises selecting an isolation layer that exhibits a substantially higher etch rate compared to that of the gate oxide while using the second etchant.

5. The method for preventing a gate oxide damage of claim 1 wherein said gate oxide damage would lead to an excessive leakage current through the trench MOSFET and, correspondingly, adding an isolation layer further comprises selecting an isolation layer that is capable of preventing the bottom layer patterning process from causing damage to the gate oxide.

6. The method for preventing a gate oxide damage of claim 5 wherein the wafer is made of Silicon.

7. The method for preventing a gate oxide damage of claim 6 wherein the trench MOSFET is an N-channel MOSFET or a P-channel MOSFET.

8. The method for preventing a gate oxide damage of claim 7 wherein the upper body of the trench MOSFET is made of a bi-layer of a pad oxide atop a gate oxide.

9. The method for preventing a gate oxide damage of claim 8 wherein said gate oxide is thermally grown atop the wafer during wafer processing.

10. The method for preventing a gate oxide damage of claim 9 wherein said pad oxide is thermally grown atop the gate oxide.

11. The method for preventing a gate oxide damage of claim 8 wherein the bottom layer is made of a low temperature oxide (LTO) deposited with a low temperature deposition process.

12. The method for preventing a gate oxide damage of claim 11 wherein the patterning process for the LTO uses an etchant and, correspondingly, adding an isolation layer further comprises selecting an isolation layer that exhibits a substantially lower etch rate compared to that of the LTO.

13. The method for preventing a gate oxide damage of claim 12 wherein selecting an isolation layer further comprises using a $Si_3N_4$ layer to be the isolation layer.

14. The method for preventing a gate oxide damage of claim 13 wherein adding an isolation layer further comprises forming, with a low pressure chemical vapor deposition (LPCVD) process, the $Si_3N_4$ layer atop the pad oxide.

15. The method for preventing a gate oxide damage of claim 14 wherein patterning the LTO further comprises choosing an LTO-etch chemical that further maximizes a differential etch rate between LTO and $Si_3N_4$ to insure that, at the completion of the LTO patterning process, sufficient amount of $Si_3N_4$ is still left to protect the pad oxide layer underneath.

16. The method for preventing a gate oxide damage of claim 15 wherein choosing an LTO-etch chemical further comprises using a hydrofluoric acid (HF) to etch the LTO.

17. The method for preventing a gate oxide damage of claim 15 wherein removing those portions of the isolation layer that are not beneath the ESD protection modules further comprises choosing a $Si_3N_4$-etch chemical that exhibits a sufficient differential etch rate between $Si_3N_4$ and pad oxide to insure that, at the completion of the isolation layer removal process, sufficient amount of pad oxide is still left to protect the gate oxide layer underneath.

18. The method for preventing a gate oxide damage of claim 17 wherein choosing a $Si_3N_4$-etch chemical further comprises using a hot phosphoric acid ($H_3PO_4$) to etch the $Si_3N_4$.

19. A method of forming an ESD-protected trench MOSFET device in a semiconductor substrate having an active area with a plurality of trench gates and a termination area, the method comprises sequential steps:
  a) forming a first oxide layer on top of the semiconductor substrate;
  b) forming a nitride layer over the first oxide layer;
  c) forming a second oxide layer over the nitride layer;
  d) depositing a polysilicon layer over the second oxide layer;
  e) forming a plurality of ESD-protection diodes in a first portion of the polysilicon layer that is within the termination area and removing a second portion of the polysilicon layer that is within the active area;
  f) removing the second oxide layer within the active area; and
  g) removing the nitride layer in the active area whereby form said ESD-protected trench MOSFET device.

* * * * *